(12) United States Patent
Zhao et al.

(10) Patent No.: US 12,184,317 B2
(45) Date of Patent: Dec. 31, 2024

(54) 5G MILLIMETER WAVE DUAL-BAND DUAL-MODE MIXER AND WIRELESS COMMUNICATION TERMINAL

(71) Applicant: University of Electronic Science and Technology of China, Chengdu (CN)

(72) Inventors: Chenxi Zhao, Chengdu (CN); Kai Kang, Chengdu (CN); Yiming Yu, Chengdu (CN); Huihua Liu, Chengdu (CN); Yunqiu Wu, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 18/262,503

(22) PCT Filed: Jan. 13, 2023

(86) PCT No.: PCT/CN2023/072081
§ 371 (c)(1),
(2) Date: Jul. 21, 2023

(87) PCT Pub. No.: WO2023/221541
PCT Pub. Date: Nov. 23, 2023

(65) Prior Publication Data
US 2024/0267069 A1 Aug. 8, 2024

(30) Foreign Application Priority Data

May 18, 2022 (CN) .......................... 202210542995.9

(51) Int. Cl.
*H04B 1/16* (2006.01)
*H03D 7/14* (2006.01)
*H04B 1/24* (2006.01)

(52) U.S. Cl.
CPC ......... *H04B 1/1607* (2013.01); *H03D 7/1441* (2013.01); *H04B 1/24* (2013.01)

(58) Field of Classification Search
CPC ....... H04B 1/1607; H04B 1/24; H03D 7/1441
See application file for complete search history.

(56) References Cited

U.S. PATENT DOCUMENTS

| 2005/0118979 A1* | 6/2005 | Langenberg | H03D 7/1433 455/292 |
| 2008/0169859 A1* | 7/2008 | Garcia | H03D 7/1491 327/355 |
| 2021/0119580 A1* | 4/2021 | Zafrany | H03D 7/1458 |

OTHER PUBLICATIONS

CN 202210542995.9, First Office Action, mailed Sep. 21, 2023,11 pages. (with English translation).
(Continued)

*Primary Examiner* — Nguyen T Vo
(74) *Attorney, Agent, or Firm* — Getech Law LLC; Jun Ye

(57) ABSTRACT

This invention, falling into the field of radio communication technology, discloses 5G millimeter wave dual-band dual-mode mixer and wireless communication terminal. In the said 5G millimeter wave dual-band dual-mode mixer, the first MOSFET is connected to the source of the second MOSFET and the third MOSFET through its drain, with the first MOSFET connected to the drain of the fourth MOSFET through its drain. The second MOSFET is connected to one end of the first capacitor through its gate, with the other end of the first capacitor connected to the drain of the third MOSFET. The third MOSFET is connected to one end of the second capacitor through its gate and the other end of the second capacitor is connected to the drain of the second MOSFET.

4 Claims, 2 Drawing Sheets

(56) References Cited

OTHER PUBLICATIONS

CN 202210542995.9, Decision to Grant, mailed Oct. 13, 2023, 2 pages. (with English translation).

* cited by examiner

5G MILLIMETER WAVE DUAL-BAND DUAL-MODE MIXER AND WIRELESS COMMUNICATION TERMINAL

CROSS REFERENCE OF RELATED APPLICATION

The present application is a 371 of international Application PCT/CN2023/072081, filed Jan. 13, 2023, which claims priority to Chinese Patent Application No. 202210542995.9 filed May 18, 2022. The contents of the applications are incorporated herein by reference in their entireties.

TECHNICAL FIELD

This invention, falling into the field of radio communication technology, involves 5G millimeter wave dual-band dual-mode mixer and wireless communication terminal.

BACKGROUND TECHNOLOGY

At present, in the application of 5G millimeter wave technology, RF chips are often required to process the RF information near 27 GHz and 39 GHz simultaneously to realize dual-band transceiver communication. The receiver chip shall not only be able to amplify the signals of the two bands simultaneously but also down-convert the RF signals of the two bands to IF signals without interfering with each other under proper frequency conversion mode. In the case of the 5G millimeter wave bands 24.25-27.5 GHz and 37.5-42.5 GHz in China, the frequency conversion method of a single frequency point local oscillator is adopted. If the local oscillator frequency is lower than 24.25 GHz, the upper limit of the IF would exceed 42.5 GHz-24.25 GHz=18.25 GHz after dual-band down conversion is completed, for excessive wide IF would add to the difficulties of designing IF links. If the local oscillator frequency is located between two bands, the image frequency would emerge, and the two frequencies that are over the frequency of the local oscillator would down-convert to the IF of the same frequency, leading to inter-aliasing of two groups of signals and affecting subsequent signal demodulation. Therefore, to realize the down-conversion of dual-band receivers, the bandwidth design pressure of IF and local oscillator shall be reduced, and the image shall be avoided. A common realization method is to change the modes of reconfigurable receivers based on Hartley architecture so as to extract different sideband signals (as shown in FIG. 2). The architecture shown in the figure is the dual-band down conversion solution for receivers based on Hartley structure whose working modes have been changed. Taking the input of 27 GHz and 39 GHz, two RF frequencies in 5G applications, as an example, when the RF signals are converted into IF signals, the 27 GHz signal is black and the 39 GHz signal is gray. The two RF signals are input into the upper and lower mixers respectively. The 33 GHz local oscillator signal is divided into two paths with a phase of −90° and 0° through a quadrature signal generator, and then input into the upper mixer and lower mixer respectively. In the upper mixer, the 33 GHz signal with a phase of −90° subtracts the 27 GHz signal with a phase of 0°, obtaining a 6 GHz IF signal with a phase of −90°; and the 39 GHz signal with a phase of 0° subtracts the 33 GHz signal with a phase of −90° signal, and obtains a 6 GHz IF signal with a phase of 90°. The output of the upper mixer can become two 6 GHz IF signals with a phase of −180° and 0° respectively after passing through a 900 phase shifter. Since the phase of the local oscillator signal is 0°, the signal of 27 GHz and 39 GHz would both be down-converted to 6 GHz signals with a phase of 0° in the lower mixer. Then, the upper and lower signals are combined. When the information on the two paths is combined, the IF signals obtained through 27 GHz frequency conversion are in the opposite phase, so they cancel each other and are suppressed. Since the IF signals obtained through 39 GHz frequency conversion are both in phase 0°, they can be combined and output. When the information on the two paths is subtracted, the IF signals obtained through 27 GHz frequency conversion are in the same phase, so they can be output after being combined. The IF signals obtained through 39 GHz are both in phase 0°, so they cancel each other after subtraction and are then suppressed. Similarly, other frequency points in frequency bands near 27 GHz and 39 GHz can all use this structure to suppress image frequency while performing down conversion. Although the above-mentioned down conversion solution can achieve dual-band down conversion and suppress image frequency. The following flaws still exist. (1) Large layout area and complex wiring. With this solution, signals shall be divided into upper and lower paths to perform frequency conversion and phase shifting, with each path having its matching network. After introducing the quadrature generator at the local oscillator, the layout area of the whole down conversion module will become quite large. When drawing the layout, measures shall be taken to ensure that the wiring of the upper and lower three-port mixer is balanced. The signal input by the local oscillator into the mixer often needs to be differentiated, which would make the layout and wiring extremely complex. (2) High power demand for the local oscillation signal. In this solution, the upper and lower mixers shall be driven simultaneously, with the local oscillator power being 3 dB higher than the original power. Since the on-chip millimeter wave band quadrature generator will trigger a great loss, the local oscillator power needs to be increased by over 3 dB to compensate for the loss. In this regard, the solution requires a high local oscillator signal power, leading to greater design pressure of the local oscillator link and higher power consumption. (3) Image frequency suppression system worsened by processing errors. The effect of this solution depends on the performance of the local oscillator quadrature generator and the IF 90° phase shifter, while the capacitors, inductors, or other coupling structures applied for the generator and shifter are quite sensitive to technological processing, and would easily result in errors during processing. The quadrature generator may trigger additional phase shift and amplitude imbalance after processing, while the 90° phase shifter may lead to additional phase shift and insertion loss after processing. These amplitudes and phases errors will make it impossible for the two signals to cancel each other completely when performing adding and subtracting at the output end, which would further worsen the image frequency suppression system.

According to the above analysis, the problems and defects of existing technologies can be summarized as oversized layout area of existing technology and complex wiring, as well as higher demand for power of local oscillator signal, and vulnerability of processing errors to worsen the image frequency suppression system.

SUMMARY

To solve existing technical problems, this invention provides 5G millimeter wave dual-band dual-mode mixer and wireless communication terminal.

This invention is realized with a 5G millimeter wave dual-band dual-mode mixer. The said 5G millimeter wave dual-band dual-mode mixer is equipped with the first MOSFET, which is connected to the source of the second and the third MOSFET and the drain of the fourth MOSFET through its drain.

The second MOSFET is connected to one end of the first capacitor through the gate, with the other end of the first capacitor connected to the drain of the third MOSFET.

The third MOSFET is connected to one end of the second capacitor through the gate, with the other end of the second capacitor connected to the drain of the second MOSFET.

Further, the said first MOSFET is connected to the ground through the source, and connected to the RF input signal through the gate. The fourth MOSFET is connected to Vdd through the source, while the fourth MOSFET is connected to the bias voltage Vb1 through the gate.

Further, the said second MOSFET and the third MOSFET are connected to the positive and negative ends of the local oscillator signal through their gates, and connected to the two ports of the primary coil of the transformer through their drains.

Further, the said transformer is connected to the Vdd after being cascaded with the first inductor through the center tap of the primary coil. The center tap of the secondary coil is connected to the ground, with the two ports of the secondary coil connected to the source of the fifth and the sixth MOSFET.

Further, the said sixth MOSFET is connected to bias voltage Vb2 through the gate, with the sixth MOSFET connected to the drain of the eighth MOSFET through its drain.

Further, the said fifth MOX tube is connected to bias voltage Vb2 through the gate, with the fifth MOSFET connected to the drain of the seventh MOSFET, the gate of the seventh MOSFET, and the gate of the eighth MOSFET through its drain.

Further, the said seventh and the eighth MOSFET are connected to the Vdd through the source.

Further, the said sixth MOSFET is connected to one end of the fourth capacitor through the drain, with the other end of the fourth capacitor connected to the first input end of the single-pole double-throw switch after being cascaded with the second inductor.

Further, the said transformer is connected to one end of the third capacitor through the center tap of the primary coil, with the other end of the third capacitor connected to the second input end of the single-pole double-throw switch. The input end of the single-pole double-throw switch is connected to the IF output port.

Another purpose of this invention is to provide a receiver chip for 5G millimeter wave communication. The said receiver chip of 5G millimeter wave communication contains the said 5G millimeter wave dual-band dual-mode mixer. The said receiver chip of the 5G millimeter wave communication operates covers the two millimeter wave bands near 27 and 39 GHz simultaneously.

Another purpose of this invention is to provide a radio communication terminal. The said radio communication terminal is equipped with the 5G millimeter wave dual-band dual-mode mixer described in any of claims 1-4.

According to the above technical solution and the technical problems solved, the benefits and positive effects that can be achieved by the technical solution to be protected by the present invention are analyzed from the following aspects:

First, according to the aforesaid existing technical problems and the difficulty of solving the problems, a detailed and in-depth analysis of how the technical problems are solved by the technical solution proposed in this invention as well as the creative technical effects achieved after these problems are solved is conducted based on the technical solution to be protected by the invention as well as the results and data of the R&D process. The detailed description is as follows:

This invention generates the differential-mode signal by mixing the lower frequency band in the RF dual band with the fundamental wave of the local oscillator through the core of the mixer, produces the common-mode signal by mixing the higher frequency band in the RF dual band with the second harmonic wave of the local oscillator, and then extracts the common-mode signal through the center tap of the transformer and the differential-mode signal through the coil coupling characteristics of the transformer, so as to distinguish the IF generated after mixing the two frequency bands. After the differential-mode signal is converted into a single-ended signal through active Balun, the single-ended signal and the common-mode signal are input into the switch respectively to select the output signal. In this way, the down-conversion of a 5G millimeter wave dual-band signal is realized with the image frequency being out-of-band, avoiding image frequency suppression. This invention applies the differential-mode and common-mode extraction methods of the transformer to distinguish the information generated after the frequency conversion of the two bands. Compared with the traditional distinguishing method combining a quadrature generator and 90° phase shifter, the frequency shift and impedance fluctuation caused by processing errors are less sensitive. In this way, the mutual interference between the two bands can be suppressed in a stable manner while avoiding large layout areas and complex layouts and wiring. This invention uses the secondary coil of the transformer to which the active Balun is input by the common-gate stage to maintain the balanced and similar input impedance in the wide IF band and ensure the stability of the transformer during differential-mode and common-mode extraction. Besides, the LC network is used to access the center tap of the primary coil of the transformer to form a high-order matching network with the transformer and flatten the output impedance of the common mode signal in a wider IF bandwidth. The core part of the mixer of this invention is equipped with a current injection type active mixer with high gain. A neutralizing capacitor is used to improve the stability of the core part of the mixer.

The purpose of the invention is to realize down conversion of information on frequency bands near 27 GHz and 39 GHz during the application of 5G millimeter wave communication technology, and effectively suppress in-band image frequency without causing high consumption of area and power. With the development of 5G technology, many countries applied the two frequency bands near 27 GHz and 39 GHz in 5G communication, for example, the 24.25-27.5 GHz and 37.5-42.5 GHz 5G millimeter-wave frequency bands in China. For 5G millimeter wave receiver chips, to process the information of the two frequency bands and convert to IF signal under lower frequency, the in-band image frequency should be avoided to prevent interference with the main signal. The application of traditional image frequency suppression technology in a 5G millimeter-wave band might cause a series of problems, including excessive filter area, the wide bandwidth of the local oscillator, and an increase in link power consumption. This invention proposes a down-conversion mixer of a new structure. Based on a single-balance mixer structure, the mixer supports such two frequency mixing modes as mixing the RF signal with fundamental wave or second harmonic of local oscillator, corresponding to the frequency band represented by 27 GHz and 39 GHz, respectively. Then, differential-mode and common-mode extraction are performed to output the IF. This invention has realized the down-conversion of two frequency band signals with one mixer, suppressing the mutual interference between two frequency band signals without consuming too much power and area.

Second, seeing the technical solution as a whole or looking from the perspective of products, details of the technical effects and advantages of the technical solution to be protected by this invention are as follows:

This invention can extract the differential-mode signal by the local oscillator fundamental wave mixing and load transformer coupling and the common-mode signal by local oscillator second harmonic mixing through center tap extraction, which corresponds to the down-conversion of two frequency band signals of 5G communication. Then, different signal outputs are selected through active Balun, LC matching network, and single-pole, double-throw switch to realize a dual-mode down mixer applicable to a 5G millimeter wave dual-band receiver. This invention covers the two bands of a 5G millimeter wave. However, the local oscillator bandwidth and IF bandwidth are relatively narrow, which indicates that the implementation complexity of LO and IF will be reduced for dual-band receivers. Compared with traditional solutions, this invention does not need the quadrature generator, the second mixer, and a 90° phase shifter, which means the local oscillator power demand is reduced with the layout simplified. Besides, the interference between the two bands can also be effectively suppressed with the image frequency being out-of-band. Therefore, the technical solution proposed by this invention is more suitable for the application of a 5G millimeter wave.

Third, the inventive supporting evidence of the claims of this invention can be found in the following important aspects:

(1) The expected yield and commercial value of the technical solution of this invention after commercialization: This invention, after being applied for 5G millimeter wave dual-band receiver chips, can save the chip area and reduce the power consumption of chips.

(2) The technical solution proposed by this invention has solved the technical problem that people have long been struggling with but failed to settle: the traditional dual-band receiver frequency conversion module cannot be realized with a single-mixer core. Instead, two mixers combined with a local oscillation quadrature generator and a 90° phase shifter are needed, which would make the layout complex and the layout area excessively large. However, this invention only needs one mixer core, avoiding complex layout and large layout area.

INSTRUCTIONS ON DRAWINGS

Figure 3:
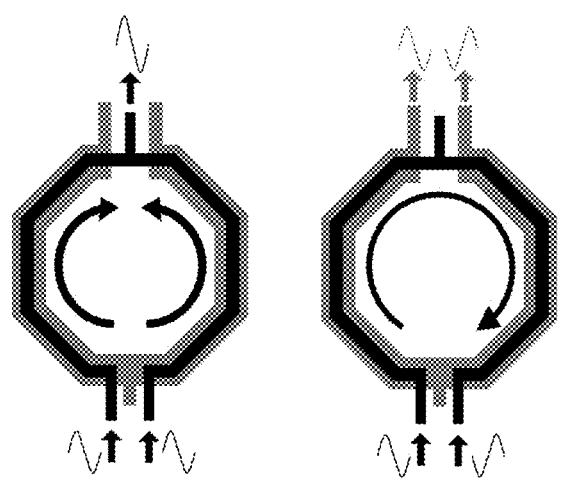
FIG. 3 shows the principles of differential-mode and common-mode extraction performed by the transformer provided by the embodiment of this invention.

In FIG. 3: Fig. a shows the common mode, while Fig. b shows the different mode;

In the figure: 1. The first MOSFET; 2. The second MOSFET; 3. The third MOSFET; 4. The fourth MOSFET; 5. The fifth MOSFET; 6. The sixth MOSFET; 7. The seventh MOSFET; 8. The eighth MOSFET; 9. The first capacitor; 10. The second capacitor; 11. The third capacitor; 12. The fourth capacitor; 13. The first inductor; 14. The second inductor; 15. Single pole, double throw switch; 16. Transformer.

EMBODIMENT

To clarify the purpose of this invention, technical solution, and advantages, a detailed description of this invention is provided together with the following embodiment. It should be understood that the embodiment described herein can only be used to explain this invention, not limiting the invention.

I. Explanation of embodiment. To help technical personnel in this field fully understand how to realize this invention, a detailed description of the embodiment is offered in this part to explain the technical solution proposed in the claims.

Figure 1:
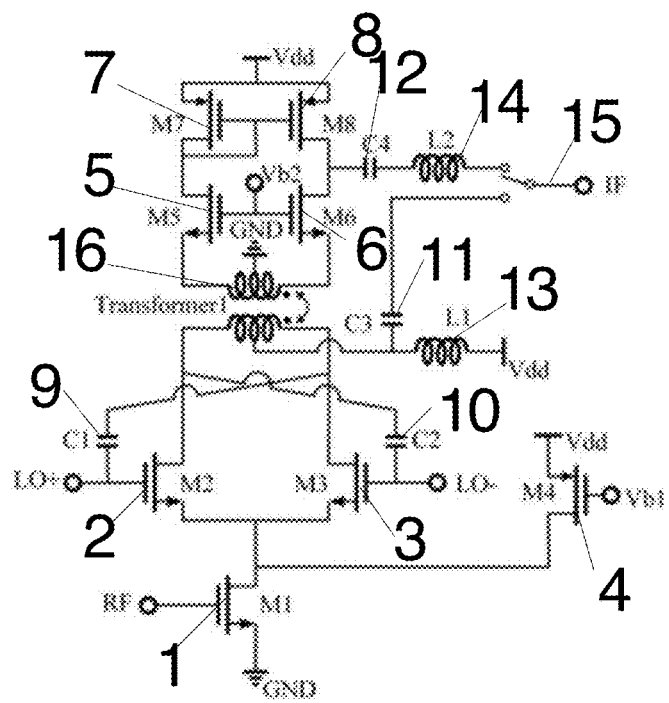
FIG. 1 is the schematic drawing that shows the structure of the 5G millimeter wave dual-band dual-mode mixer provided by the embodiment of this invention.
Figure 2:
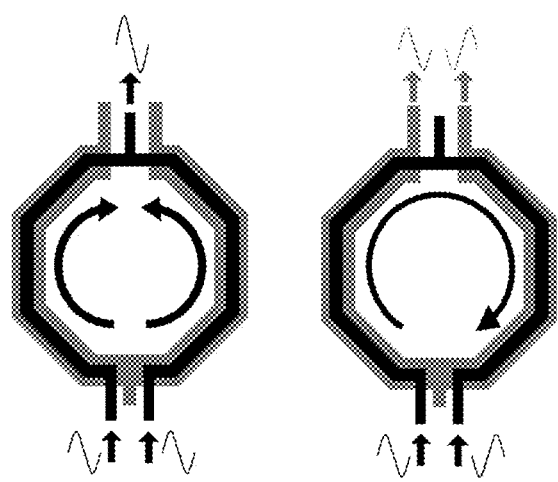
FIG. 2 is the schematic drawing of the circuit of the dual-band down conversion solution with the function of suppressing image frequency provided by the embodiment of this invention.

As shown in FIG. 1, in the 5G millimeter wave dual-band dual-mode frequency converter provided in the embodiment of this invention, the source of the first MOSFET 1 is connected to ground, with its gate connected to the RF input signal and its drain connected to the source of the second MOSFET 2 and the third MOSFET 3. The source of the fourth MOSFET 4 is connected to Vdd, with its gate connected to the bias voltage Vb1 and its drain connected to the drain of the first MOSFET 1. The gates of the second MOSFET 2 and the third MOSFET 3 are connected to the positive and negative ends of the signal of the local oscillator, respectively, with the drains connected to the two ports of the primary coil of transformer 16. Transfer 16 is Transformer 1, and the center tap of its primary coil is connected to Vdd after being cascaded with the first inductor 13. The center tap of the secondary coil is grounded, while the ports on both sides of the secondary coil are connected to the sources of the fifth MOSFET 5 and the sixth MOSFET 6, respectively. One end of the first capacitor 9 is connected to the gate of the second MOSFET 2, with the other end connected to the drain of the third MOSFET 3. One end of the second capacitor 10 is connected to the gate of the third MOSFET 3, with the other end connected to the drain of the second MOSFET 2. The gate of the sixth MOSFET 6 is connected to the bias voltage Vb2, with its drain connected to the drain of the eighth MOSFET 8. The gate of the fifth MOSFET 5 is connected to the bias voltage Vb2, with its drain connected to the drain of the seventh MOSFET 7, the gate of the seventh MOSFET 7, and the gate of the eighth MOSFET 8. The sources of the seventh MOSFET 7 and the eighth MOSFET 8 are connected to the Vdd. One end of the fourth capacitor 12 is connected to the drain of the sixth MOSFET 6, with the other end connected to the first input end of the single pole double throw switch 15 after being cascaded with the second inductor 14. One end of the third capacitor 11 is connected to the center tap of the primary coil of transformer 16, with the other end connected to the second input end of the single-pole double-throw switch. The output end of the single-pole double-throw switch 15 is connected to the IF output port.

The operating principle of this invention: the first MOSFET 1, the second MOSFET 2, the third MOSFET 3, the fourth MOSFET 4, the first capacitor 9, and the second capacitor 10 together constitute the core of the mixer, a current injection type single balanced active mixer structure. The first MOSFET 1 provides gain for the mixer as the transconductance stage, and the fourth MOSFET 4 can increase the drain current of the first MOSFET 1 as the current injection structure, which can further increase the gain of the mixer. The second MOSFET 2 and the third MOSFET 3 is the switching tube of the mixer. The phase difference of the local oscillator signal to which the gate is connected is 180°. Since the local oscillator signal is relatively strong, the signal transmission expression under non-linear impact shall be considered:

$$V_{ds} = a_1 V_{gs} + a_2 V_{gs}^2 + a_3 V_{gs}^3 \dots ;$$

Where, $V_{ds}$ refers to the drain-source voltage difference of the second MOSFET 2 or the third MOSFET 3; $V_{gs}$ is the gate-source voltage difference of the second MOSFET 2 or the third MOSFET 3. Under the effect of the local oscillator signal, $a_i$ refers to the relevant non-linear coefficient. For the second MOSFET 2, $V_{gs}=A\cos(\omega_{LO}t)$. The third MOSFET 3, $V_{gs}=-A\cos(\omega_{LO}t)$, where A refers to the voltage amplitude of the local oscillator signal, while $\omega_{LO}$ represents the angular frequency of the local oscillator signal. The primary term is mixed with the fundamental wave of the local oscillator, with the second MOSFET 2 and the third MOSFET 3 breaking successively to perform frequency mixing with the RF signal entering from the source, outputting the signals of $b_1\cos(\omega_{RF}-\omega_{LO})$ and $-b_1\cos(\omega_{RF}-\omega_{LO})$ respectively. Among the two signals, $b_1$ is the voltage amplitude of the two signals and $\omega_{RF}$ refers to the angular frequency of the RF signal. The two signals are equiamplitude phase-inverted signals and are output as differential-mode signals. The secondary term is mixed with the secondary harmonic wave of the local oscillator. $V_{gs}$ expression is substituted. Since the squared results of A and −A are the same, there is no phase difference. The signal of the drain frequency mixing of the second MOSFET 2 or the third MOSFET 3 is output as the common signal $b_2\cos(2\omega_{LO}-\omega_{RF})$, with $b_2$ being the voltage amplitude of the signal. To ensure the gain of secondary harmonic mixing, the gate DC voltage of the second MOSFET 2 and the third MOSFET 3 should be biased at a relatively large amplitude of the secondary harmonic near the threshold voltage. The first capacitor 9 and the second capacitor 10 are neutralizing capacitors used to ensure the operation stability of the second MOSFET 2 and the third MOSFET 3 of the mixer.

On one hand, transformer 16 (Transformer 1) is used to match with 4-6 GHz IF signal as the core load of the mixer. On the other hand, it is used to extract differential-mode signals and common-mode signals, with the extraction principle shown in FIG. 3. In FIG. 3, the primary coil is black and connected to the core of the mixer. The secondary coil is grey and connected to the source of the fifth MOSFET 5 and the sixth MOSFET 6. When the common-mode signal enters the primary coil (as shown in Fig. a of FIG. 3), the two signals go through half of the circumference of the primary coil. With the same amplitude and phase, the two signals are strengthened through superposition directly at the center tap. After being extracted from the center tap, given the symmetry and balance of transformer 16, the common-mode signal will not be coupled to the secondary coil and therefore will not be exported from the secondary coil. When the differential-mode signal enters the primary coil (as shown in Fig. b of FIG. 3) and the two signals go through the other half circumference of the primary coil and reach the center tap, they cancel each other as equiamplitude phase-inverted signals. The AC field can then be observed at the center tap of the primary coil, which means the signals would not flow out of the center tap. The differential-mode signal will travel a large circle from one port of the primary coil to the other, which will couple the electromagnetic energy to the secondary coil. Take the local oscillator 22 GHz as an example. The RF signal of 27 GHz can be mixed to produce a differential-mode signal of 27 GHz-22 GHz=5 GHz, which will then be coupled from the secondary coil of transformer 16. The RF signal of 39 GHz can be mixed to produce a common-mode signal of 2×22 GHz-39 GHz=5 GHz, which can be extracted through the center tap of the primary coil. In this way, the extraction of the differential-mode and common-mode signals generated after the frequency mixing process under two frequency bands is realized. The first inductor 13 is the load of the common-mode IF signal, and the third capacitor 11 is the capacitor that blocks the DC. The two form an LC matching network to guide the 4-6 GHz IF signal to single pole double throw switch 15. The first MOSFET 1 to the eighth MOSFET 8, the fourth capacitor 12, and the second inductor 14 form an active Balun. The differential-mode IF signal enters the source of the fifth MOSFET 5 and the sixth MOSFET 6 respectively from the two output ports of the secondary coil, with the fifth MOSFET 5 and the sixth MOSFET 6 forming a common gate structure, amplifying and outputting the signal from the drain. The signal from the drain of the fifth MOSFET 5 enters the gate of the eighth MOSFET 8 and is inverted once more to output from the drain of the eighth MOSFET 8, so the output signals from the drains of the sixth MOSFET 6 and the eighth MOSFET 8 are in the same phase and superimposed into the fourth capacitor 12. The fourth capacitor 12 is a DC-blocking capacitor, and the second inductor 14 forms a matching network with the fourth capacitor 12 to introduce the 4-6 GHz IF signal into the single-pole double-throw switch and, at the same time, to regulate the input impedance balance of the active Balun. The size of the fifth MOSFET 5 is slightly larger than the sixth MOSFET 6, and the size of the seventh MOSFET 7 is slightly larger than the eighth MOSFET 8, so the input impedance of the source of the fifth MOSFET 5 and the sixth MOSFET 6 is made similar. The single-pole double-throw switch 15 is used to select to output the extracted differential-mode or common-mode signal to the IF. When the local oscillator signal is 22 GHz, the image frequency of the 27 GHz RF signal is 17 GHz, while the image frequency of the 39 GHz RF signal being 49 GHz, both out of the RF band. In this way, the forestage matching network can be filtered. With such a method that performs fundamental wave mixing and secondary harmonic frequency mixing switching through differential-mode and common-mode extraction, it is possible to convert the information of two different frequency band RF into the same IF by switching the mode while maintaining the frequency of the local oscillator unchanged, significantly reducing the bandwidth design pressure of the IF and local oscillator.

When the IF bandwidth is $f_{if1}\sim f_{if2}$ and the range of the local oscillator is $f_{lo1}\sim f_{lo2}$, the RF end of the mixer can cover such two frequency bands as $f_{if1}+f_{lo1}\sim f_{if2}+f_{lo2}$ and $2f_{lo1}-f_{if2}\sim 2f_{lo2}-f_{if1}$. If the IF signal is 4-6 GHz while the local oscillator signal is 20-24 GHz, the two millimeter-wave bands 24.25-27.5 GHz and 37.5-42.5 GHz of the 5G communication used in China can be covered.

II. Application embodiment. To prove the inventiveness and technical value of the technical solution proposed by this invention, this part provides application embodiment of specific products or relevant technologies concerning the technical solution described in the claims. This invention can be applied to 5G millimeter wave communication receiver chips, enabling the chips to operate under the two millimeter wave frequency bands near 27 GHz and 39 GHz simultaneously.

III. Evidence of the effects achieved in the embodiment. The embodiment of this invention has achieved certain positive effects during the R&D or application. Compared with existing technologies, it has great advantages. The data and graphs of the text process are described as follows:

This invention can, by improving traditional single-balance active mixers, extract the differential-mode signal mixing by local oscillator fundamental wave and the common-mode signal mixing by local oscillator second harmonic through load transformer coupling and center tap extraction, which corresponds to the down-conversion of two frequency band signals of 5G communication. Then, different signal outputs are selected through active Balun, LC matching network, and single-pole, double-throw switch to realize a dual-mode down mixer applicable to a 5G millimeter wave dual-band receiver. This invention covers the two 5G millimeter wave bands under the RF frequency. However, the local oscillator bandwidth and IF bandwidth are relatively narrow, which means a heavy link burden would not be triggered. Compared with traditional solutions, this invention does not need the quadrature generator, t second mixer, and a 90° phase shifter, which means the local oscillator power demand is reduced with the layout simplified. Besides, the interference between the two bands can also be effectively suppressed with the image frequency being out-of-band. Therefore, the technical solution proposed is more suitable for the application of a 5G millimeter wave.

The description above is only the embodiment of this invention. However, the protection scope of this invention is not limited to this extent. All technical personnel who are familiar with this technical field are within the technical scope revealed by this invention, and any modification, alternative substitution, and improvement made in the spirit and under the principle of this invention shall be covered in its protection scope.

What is claimed:

1. A 5G millimeter wave dual-band dual-mode mixer comprising:
   a first MOSFET;
   the first MOSFET is connected to a source of a second MOSFET and a source of a third MOSFET and a drain of a fourth MOSFET through its drain;
   the second MOSFET is connected to one end of a first capacitor through its gate, with the other end of the first capacitor connected to a drain of the third MOSFET;
   the third MOSFET is connected to one end of a second capacitor through its gate, with the other end of the second capacitor connected to a drain of the second MOSFET;
   the second MOSFET and the third MOSFET are connected to positive and negative ends of a local oscillator signal through their gates respectively, and the second MOSFET and the third MOSFET are connected to two ports of a primary coil of a transformer through their drains respectively;
   the transformer is connected to a Vdd after being cascaded with a first inductor through a center tap of the primary coil, wherein a center tap of a secondary coil of the transformer is connected to the ground, and a fifth MOSFET and a sixth MOSFET are connected to two ports of the secondary coil of the transformer through their sources respectively;
   the sixth MOSFET is connected to a bias voltage Vb2 through its gate, and the sixth MOSFET is connected to a drain of an eighth MOSFET through its drain;
   the fifth MOSFET is connected to the bias voltage Vb2 through its gate and to a drain of a seventh MOSFET, and the fifth MOSFET is connected to the gate of the seventh MOSFET and the gate of the eighth MOSFET through its drain;
   the seventh MOSFET and the eighth MOSFET are connected to a Vdd through their sources, respectively;
   the sixth MOSFET is connected to one end of a fourth capacitor through its drain, wherein the other end of the fourth capacitor is connected to a first input end of a single-pole double-throw switch after being cascaded with a second inductor; and
   the transformer is connected to one end of a third capacitor through the center tap of the primary coil, wherein the other end of the third capacitor is connected to a second input end of the single-pole double-throw switch and an output end of the single-pole double-throw switch is connected to an IF output port.

2. The 5G millimeter wave dual-band dual-mode mixer of claim 1, wherein the first MOSFET is connected to the ground through its source, and connected to a Radio Frequency (RF) input signal through its gate, and the fourth MOSFET is connected to a Vdd through its source and connected to a bias voltage Vb1 through its gate.

3. A 5G millimeter wave communication receiver chip includes the 5G millimeter wave dual-band dual-mode mixer described in any of claims 1-2, wherein it can operate under two millimeter wave frequency bands near 27 GHz and 39 GHz simultaneously.

4. A radio communication terminal is equipped with the 5G millimeter wave dual-band dual-mode mixer in any of claims 1-2.

* * * * *